United States Patent [19]

Itabashi et al.

[11] Patent Number: 5,128,532
[45] Date of Patent: Jul. 7, 1992

[54] IMAGE READING DEVICE HAVING A CONDUCTIVE LAYER FORMED BELOW A LIGHT RECEIVING WINDOW

[75] Inventors: Satoshi Itabashi, Atsugi; Toshihiro Saika; Ihachiro Gofuku, both of Hiratsuka, all of Japan

[73] Assignee: Canon Kabushiki Kaisha, Tokyo, Japan

[21] Appl. No.: 655,279

[22] Filed: Feb. 14, 1991

Related U.S. Application Data

[60] Continuation of Ser. No. 551,047, Jul. 10, 1990, abandoned, which is a continuation of Ser. No. 466,942, Jan. 18, 1990, abandoned, which is a division of Ser. No. 290,805, Dec. 23, 1988, Pat. No. 4,916,304.

[30] Foreign Application Priority Data

Oct. 7, 1986 [JP] Japan ................. 61-237066
May 31, 1987 [JP] Japan ................. 62-135420

[51] Int. Cl.⁵ .............................. H01J 40/14
[52] U.S. Cl. ..................... 250/208.1; 358/482
[58] Field of Search ........... 250/208.1, 211 R, 211 J; 358/482–483; 357/30 I, 30 H

[56] References Cited

U.S. PATENT DOCUMENTS

| 4,291,275 | 9/1981 | Higuchi et al. . |
| 4,405,915 | 9/1983 | Komatsu et al. . |
| 4,583,002 | 4/1986 | Kondo et al. ............ 250/208.1 |
| 4,621,275 | 11/1986 | Ueno et al. . |
| 4,650,984 | 3/1987 | Furushima et al. . |
| 4,651,015 | 3/1987 | Nishizawa et al. ......... 250/208.1 |
| 4,916,304 | 4/1990 | Itabashi et al. . |

FOREIGN PATENT DOCUMENTS 60-115259 6/1985 Japan .
60-239072 11/1985 Japan .

*Primary Examiner*—David C. Nelms
*Assistant Examiner*—K. Shami
*Attorney, Agent, or Firm*—Fitzpatrick, Cella, Harper & Scinto

[57] ABSTRACT

A photosensor having an electrically insulating, translucent substrate; an opaque conductive layer formed on the substrate; and insulating layer formed on the conductive layer, and a semiconductive layer formed on the insulating layer for receiving light and providing a current corresponding thereto. A pair of electrodes are formed in contact with the semiconductor layer and define a light receiving window therebetween. The electrodes are formed so as to not substantially overlap the conductive layer. The conductive layer is supplied with a bias voltage corresponding to a polarity and an amount of carriers defining the current of the semiconductor layer and a voltage Va of a small absolute value during a non-reading period of the photosensor.

3 Claims, 12 Drawing Sheets

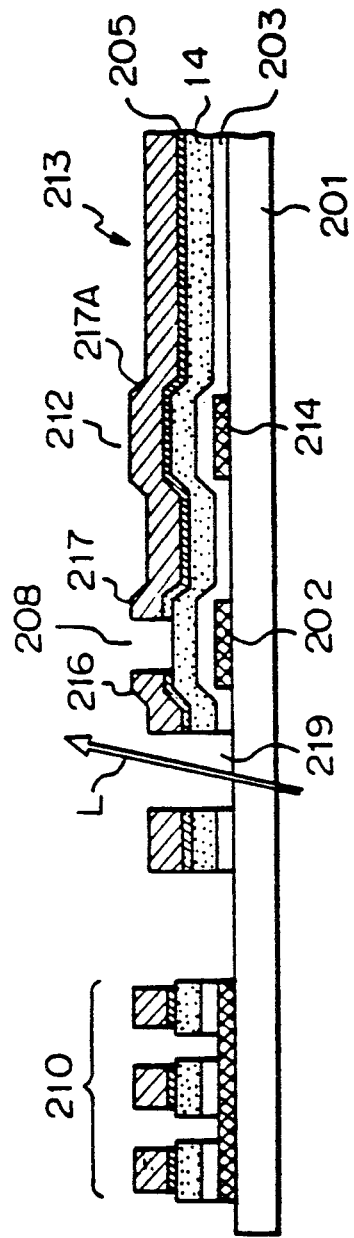
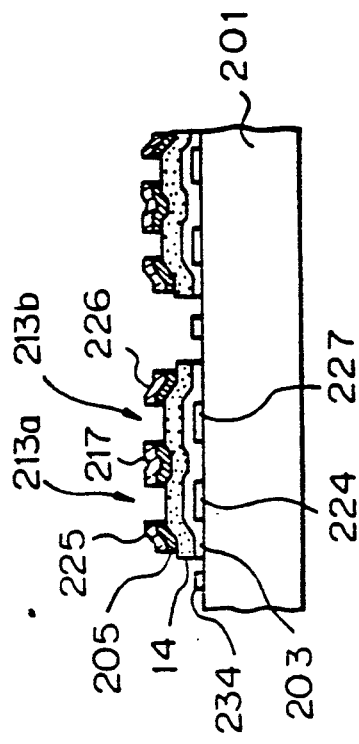
Fig. 5B
Fig. 5C

IMAGE READING DEVICE HAVING A CONDUCTIVE LAYER FORMED BELOW A LIGHT RECEIVING WINDOW

This application is a continuation of application Ser. No. 07/551,047 filed July 10, 1990, now abandoned which is a continuation of Ser. No. 466,942, filed Jan. 18, 1990, now abandoned, which is a divisional of Ser. No. 07/290,805, filed Dec. 23, 1988, now U.S. Pat. No. 4,916,304.

BACKGROUND OF THE INVENTION

1. Field of the Invention

The present invention relates to an image reading device, and more particularly, to an image reading device having, for example, a linear image sensor for reading image information by relative movement of an information bearing member, such as an original document, in contact with said linear image sensor, and adapted for use in a facsimile apparatus, a copying machine, an image reader or the like.

2. Related Background Art

In the field of image reading device utilizing a linear image sensor, there is already known a device for reading an original image by focusing said image onto a linear image sensor of a length of several centimeters in the main scanning direction, through a reduction optical system. However such a device requires a large optical path for reduction imaging, and cannot be easily miniaturized since the optical system requires a large space.

On the other hand, the use of an equal-size optical system employing a linear image sensor of a length substantially equal to the width of the original image allows a significant reduction in the space required for housing the optical system, thereby miniaturizing the reading apparatus.

FIGS. 1A and 1B are respectively a schematic plan view and a schematic cross-sectional view along a ling A—A in FIG. 1A, showing an example of photosensor employed in conventional image reading devices. On an electroinsulating substrate 1 composed of glass or ceramics, there are formed an auxiliary electrode 2 and an insulating layer 3, on which is formed is a photoconductive semiconductor layer 4 composed, for example, of hydrogenated amorphous silicon (hereinafter written as a-Si:H), or CdS.Se. There are further formed a semiconductor layer 5 doped with a semiconductive impurity for achieving the ohmic contact, and a pair of main electrodes 6, 7 thereon, defining therebetween a light receiving window 8 for introducing light into the semiconductor layer 4.

In the above-explained structure, when a positive driving voltage is supplied to the main electrode 7 light reflected from the original document and introduced into the semiconductor layer 4 induces a photocurrent, the of which change is read as image information. The auxiliary electrode 2 is given a suitable voltage to stabilize the output of the photosensor and to provide an output proportional to the light intensity.

The above-explained photosensor corresponds to one bit (one cell) in image reading, but a plurality of such photosensors may be linearly arranged to obtain a linear image sensor of equal image size.

However, in such a conventional image reading device, the main electrodes 6, 7 and the auxiliary electrode 2 constituting the photosensor provide a large spatially overlapping area (see FIG. IA) to form a large capacitance therebetween, thus lowering the response speed to light. Also a defect, such as pinhole, in the insulating layer 3 frequently results in a short circuit, thus deteriorating the production yield of the device.

SUMMARY OF THE INVENTION

An object of the present invention is to provide an image reading device not associated with the above-explained drawbacks and provided with improved sensor performance such as response speed, and with high reliability.

Another object of the present invention is to provide an image reading device provided, on an insulating substrate, with a photosensor comprising a conductive layer; an insulating layer formed on said conductive layer; a semiconductor layer formed on said insulating layer; and a pair of electrodes formed in contact with said semiconductor layer and defining therebetween a light receiving window, wherein said conductive layer is formed at said semiconductor layer directly below said light receiving window so as not or substantially not to spatially overlap with either of the paired electrodes.

BRIEF DESCRIPTION OF THE DRAWINGS

FIGS. 2A, 2B and 2C schematically show a first embodiment of the photosensor of an image reading device of the present invention, wherein FIG. 2A is a plan view, FIG. 2B is a cross-sectional view along a line B—B in FIG. 2A, and FIG. 2C is a schematic cross-sectional view similar to FIG. 2B, showing a variation of the first embodiment;

FIGS. 5A, 5B and 5C are respectively a plan view and cross-sectional views along lines D—D and E—E in FIG. 5A, showing a principal part of a third embodiment of the image reading device of the present invention;

DETAILED DESCRIPTION OF THE PREFERRED EMBODIMENTS

Now the present invention will be clarified in detail by embodiments thereof shown in the attached drawings.

Figure 1A:
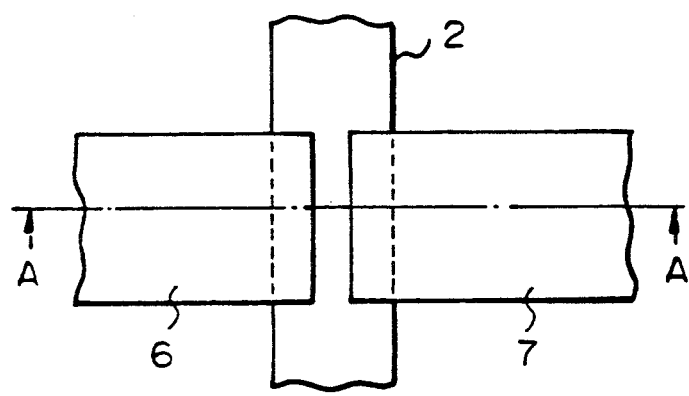
FIGS. 1A and 1B are respectively a schematic plan view and a cross-sectional view along a line A—A in FIG. 1A, showing a photosensor of a conventional image reading device.
Figure 1B:
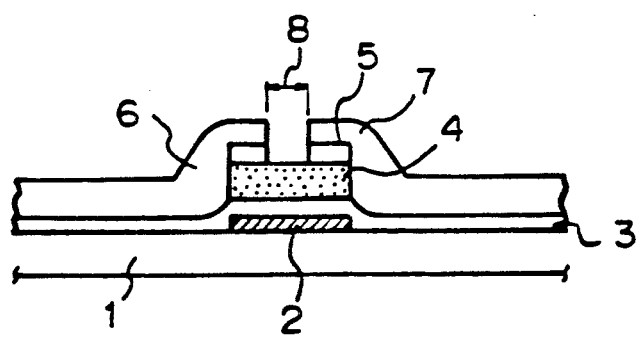
Figure 2A:
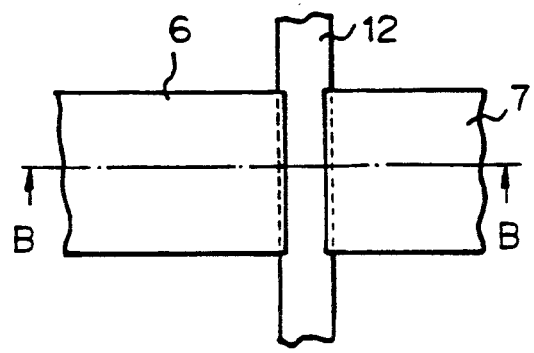
Figure 2B:
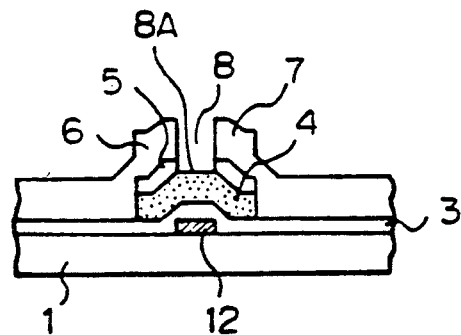

FIGS. 2A and 2B schematically illustrate a photosensor constituting a principal part of a first embodiment of the present invention. FIG. 2A is a plan view, while FIG. 2B is a cross-sectional view along a line B—B in FIG. 2A, and equivalent components to those in FIGS. 1A and 1B are represented by the same numbers.

Figure 2C:
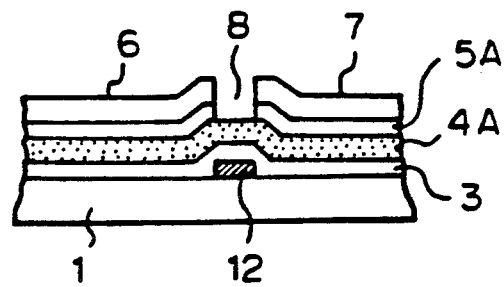
Figure 3A:
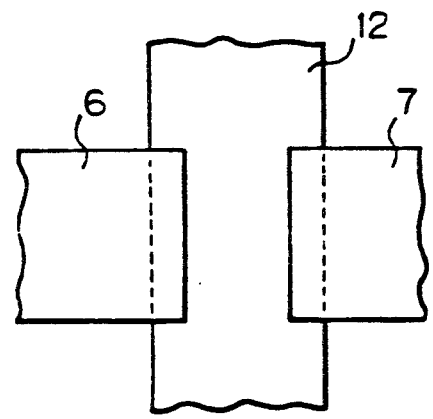
FIG. 3A and 3B are schematic plan views for explaining the features of the photosensor of the image reading device of the present invention.
Figure 3B:
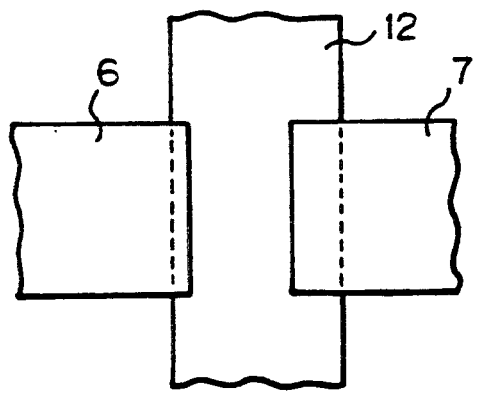

In the present embodiment, the auxiliary electrode 12, functioning as a gate electrode for the main electrodes 6 (source electrode) and 7 (drain electrode), is formed only in an area corresponding to a light-receiving area 8A of the semiconductor defined by the light receiving window 8 or with such a slightly larger width so as not to cause any practical influence (width being exaggerated in FIG. 3A). More specifically, in order to eliminate or minimize the spatial overlapping of the main electrodes 6, 7 and the auxiliary electrode 12, said electrode 12 is preferably formed with the same or practically the same dimension as that of the light receiving area 8A. However, in consideration of the aberration in said overlapping caused by a mask alignment error in the manufacturing process (cf. FIG. 3B), the auxiliary electrode 12 is preferably formed somewhat wider than the light receiving window 8, thereby adjusting said overlapping so as to minimize the fluctuation in the capacity. In any case, said overlapping, even if present, is significantly smaller than in the prior technology, thus, drastically reducing the loss in response speed and the frequency of short circuits resulting from defects such as pinholes. The semiconductor layers 4, 5 may also be constructed as 4A, 5A shown in FIG. 2C.

Figure 4A:
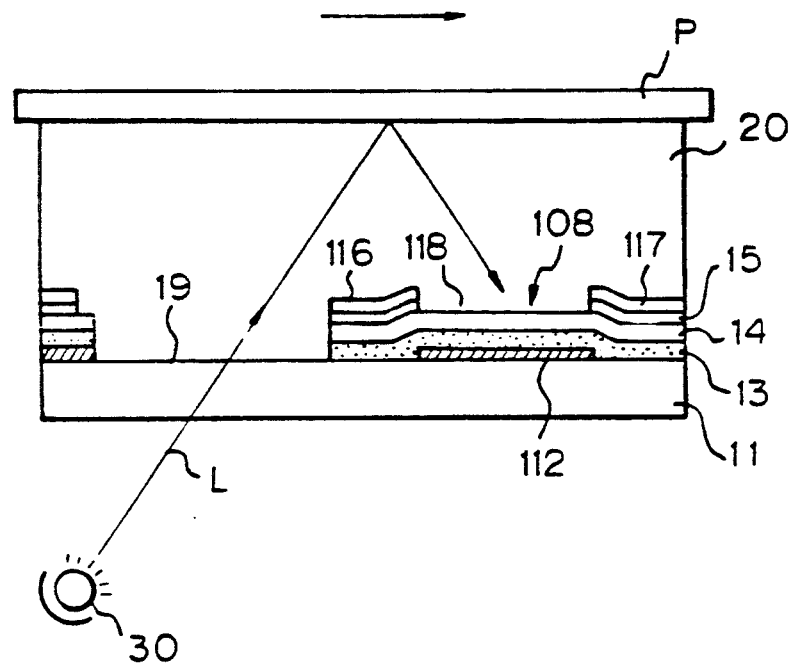
FIGS. 4A and 4B are respectively a lateral cross-sectional view along a line C—C in FIG. 4B and a plan view, showing a principal part of a second embodiment of the image reading device of the present invention.
Figure 4B:
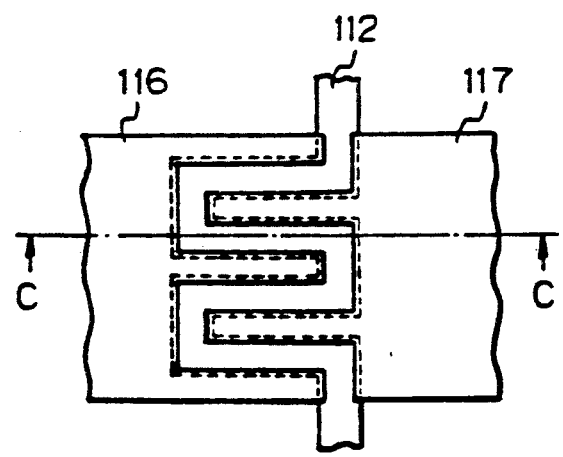

FIGS. 4A and 4B schematically illustrate an image reading device not requiring an imaging system, constituting a second embodiment of the present invention, wherein FIG. 4A is a lateral cross-sectional view, and FIG. 4B is a plan view of the photosensor thereof. FIG. 4A is the cross-sectional view along a line C—C in FIG. 4B. In these drawings, 108 indicates a photosensor arranged in plural units on a transparent substrate 11 such as glass, in a direction perpendicular to the plane of drawing to constitute a linear image sensor. Said photosensor 108 is disposed on the transparent substrate 11, of an opaque layer 112, an insulating layer 13, a photoconductive semiconductor layer 14 composed for exmaple of a-Si:H, CdS.Se, a semiconductor layer 15 doped with a semiconductive impurity to achieve the ohmic contact, and pair of main electrodes 116, 117 defining a light receiving window 118 therebetween.

In the photosensor 108 of the present embodiment, the opaque layer 112 is composed of a conductive material such as metal and is connected to a suitable power source, thereby functioning as a gate electrode for the main electrodes 116 (source electrode) and 117 (drain electrode). The main electrodes 116, 117 are formed in comb-like shape and are arranged in a mutually interlacing manner, thereby defining the light receiving window 118 in a meandering form as shown in FIG. 4B, and the opaque layer 112 is formed correspondingly. Thus the portion of the semiconductor layer 14 optically exposed by the light receiving window 118 effects photo-electric conversion by receiving the light reflected from the original document P.

The distance between the original document P and the photosensor 108 is for example in the order of 0.1 mm for obtaining a reading resolution of -8 lines/mm, but said distance has to be precisely controlled for maintaining such resolving power. Said distance control is achieved by covering the photosensor 108 with a transparent protective layer 20 of a precisely controlled thickness.

In an image reading deice of such structure as shown in FIG. 4, light L entering through the entrance window 19 of the transparent substrate 11 (photosensor 108 being protected from said light by the opaque layer 112) illuminates the original document P, and the reflected light therefrom is received by the photosensor 108 to obtain an image signal through electrode wirings. The opaque layer 112 is given a suitable voltage as explained before to stabilize the output of the photosensor and to provide an output proportional to the light intensity.

The photosensor 108 shown in FIGS. 4A and 4B corresponds to one bit (one cell) in image reading, but a plurality of such cells may be linearly arranged on the substrate 11 to obtain a linear image sensor. For example, in order to obtain a resolution of 8 lines/mm in the direction of the width of the original document P (perpendicular to the moving direction thereof indicated by an arrow in FIG. 4A) over a width of 216 mm (corresponding to the A4 size), there will be required 1728 photosensors 108.

Also said photosensor may be formed in combination with a charge accumulating capacitor for accumulating the output of said photosensor, switches for transferring the thus accumulated charge for signal processing and necessary wiring patterns, on the same substrate in the same manufacturing process.

Figure 5A:
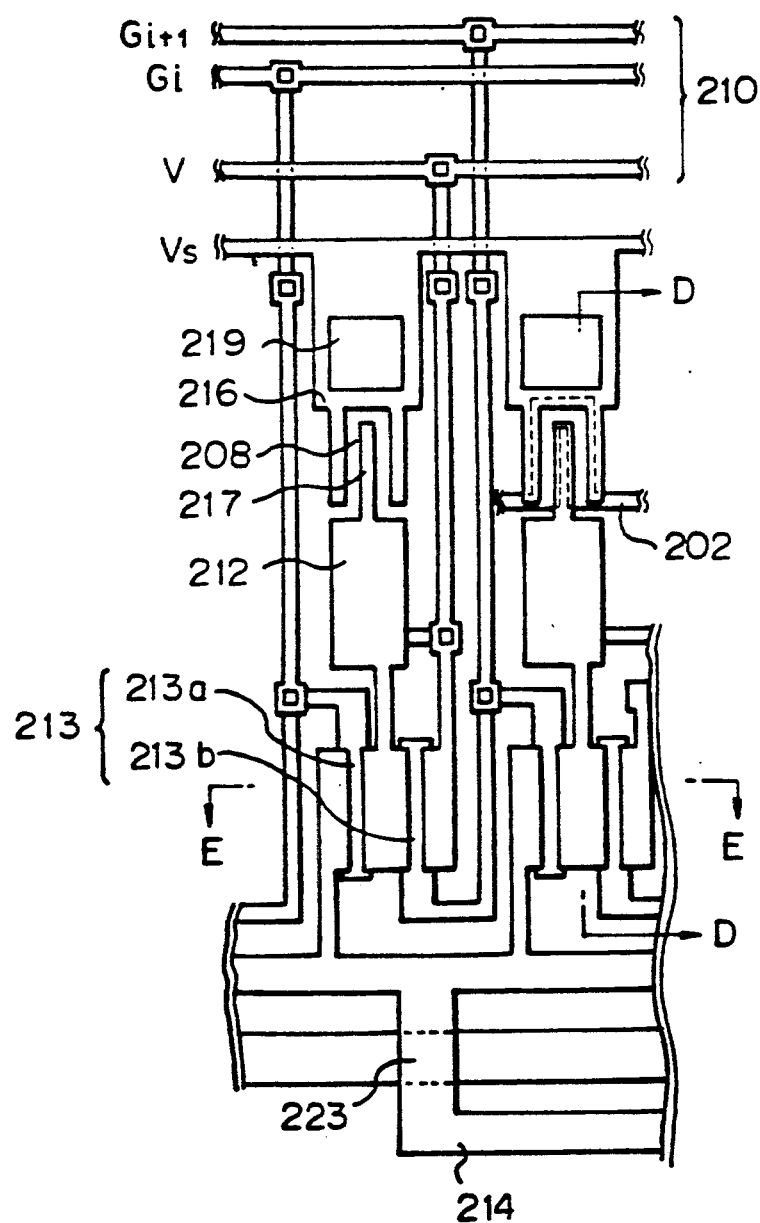

FIGS. 5A, 5B and 5C are respectively a plan view and cross-sectional views along lines D—D and E—E in FIG. 5A, schematically showing a principal part of an embodiment of the image reading device wherein such photosensor, charge accumulating capacitor and switch unit are integrally formed.

In the drawings there are shown matrix wirings 210; a photosensor 208; a charge accumulating unit 212; a switch unit 213 including a transfer switch 213a and a distance switch 213b for resetting the charge in said charge accumulating unit 212; a wiring 214 for supplying the output signal of the transfer switch to a signal processing unit to be explained later; and a load capacitor 223 for accumulating and reading the charge transferred by said transfer switch 213a.

In the present embodiment, the photoconductive semiconductor layer 14 constituting the photosensor 208, transfer switch 213a and discharge switch 213b is composed of an a-Si:H film, and the insulating layer 203 is composed of a silicon nitride film (SiNH) formed by glow discharge.

For the purpose of simplicity, FIG. 5A only shows the upper and lower electrode wirings and omits the photoconductive semiconductor layer 14 and the insulating layer 203. Said semiconductor layer 14 and the insulating layer 203 are formed not only in the areas of the photosensor 208, charge accumulating unit 212, transfer switch 213a and discharge switch 213b, but also in other areas between the upper electrode wiring and the substrate. In addition, between the upper electrodes 216, 217 and the semiconductor layer 14, there is formed an n+-doped a-Si:H layer for forming the ohmic contact.

In the wiring patterns of the linear image sensor of the present embodiment, the signal line from each photosensor is formed so as not to cross other wiring, thereby preventing crosstalk among different signal components and induction noises from the gate electrode wiring.

The light entering through the entrance window 219 and reflected by the original document P causes a change in the current in the semiconductor layer 14, between upper electrodes 216, 217. A metal opaque layer 202 is connected to a power source to be explained later.

A charge accumulating unit 212 is composed of a lower electrode wiring 214, a dielectric layer consisting of an insulating layer 203 and a photoconductive semiconductor layer 14 formed on said wiring 214, and an upper electrode wiring 217A extended from the upper electrode 217 of the photosensor, and has the structure of a so-called MIS (metal-insulator-semiconductor) capacitor. It may be biased in either direction, but is usually used with a negative bias at the lower electrode wiring 214.

FIG. 5C illustrates the switch 213 of a thin film transistor (TFT) structure including a transfer switch 213a and a discharge switch 213b, wherein said transfer switch 213a is composed of the lower electrode wiring 224 functioning as a gate electrode, the insulator layer functioning as a gate insulator layer, the photoconductive layer 14, the upper electrode wiring 225 functioning as a source electrode, and the upper electrode wiring 217A functioning as a drain electrode. In the discharge switch 213b, the gate insulating layer and the photoconductive semiconductor layer are respectively the same as the insulating layer 203 and the semiconductor layer 14. The source electrode is composed of the upper electrode wiring 217, while the gate electrode is composed of the lower electrode wiring 227, and the drain electrode is composed of the upper electrode wiring 226. A lower wiring 234 is connected to the gate electrode of the transfer switch 213a.

As explained before, between the upper electrode wirings 217A, 225, 226 and the photoconductive semiconductor layer 14 there is provided an $n^+$-doped a-Si:H layer 205 for achieving the ohmic contact.

In the linear image sensor of the present embodiment, as explained above, the photosensor charge accumulating unit, transfer switch, discharge switch and matrix wiring are all composed of a multi-layer structure having a photoconductive semiconductor layer, an insulating layer etc. and can therefore be prepared simultaneously through the same process.

Figure 6:
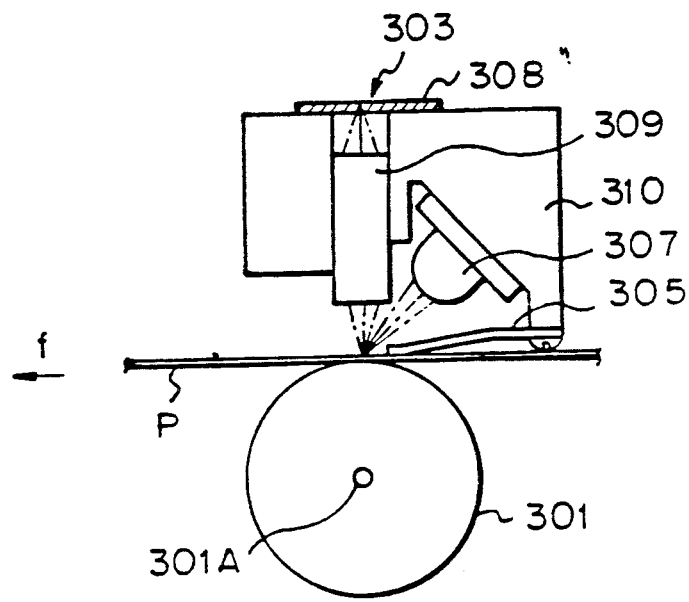
FIG. 6 is a schematic view showing a principal part of a fourth embodiment of the image reading device of the present invention.

FIG. 6 shows, as still another embodiment of the present invention, an image reading device having an imaging optical system of a short focal distance and a linear image sensor of equal image size An original document P is transported in a direction f by a transport roller 301, of which shaft 301A is rotatably supported in a predetermined position of the apparatus. A reading unit 303, positioned opposite to said transport roller, is provided with a plate spring 305 functioning as a pressing member for elastically pressing the original document P over the entire width thereof against said transport roller 301; an LED array 307 as illuminating means for illuminating the original document P; an optical system 309 composed of an array of condensing optical fibers for condensing the reflected light from the original document P; a converter unit 308 with an image sensor for photoelectric conversion of the condensed light; and a support member 310 for supporting these components.

By the rotation of the transport roller 301 by unrepresented driving means, the original document P pressed against the transport roller 301 by the pressing member 305 is transported in the direction f. In the course of transportation, the original document is illuminated by the LED array 307, and the reflected light is supplied through the optical system 309 to the converter unit 308, whereby the image on the document P is read in succession.

Figure 7:
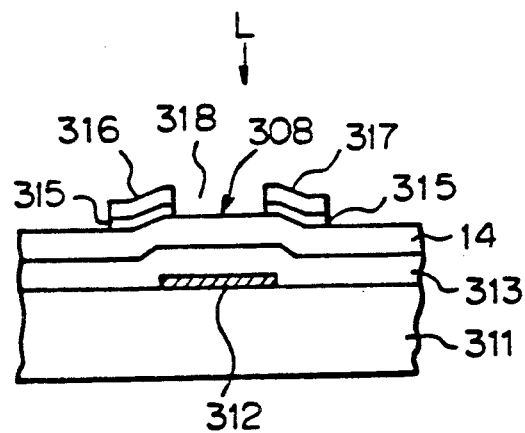
FIG. 7 is a schematic cross-sectional view of a second variation of the photosensor of the image reading device of the present invention.

FIG. 7 illustrate another embodiment of the photosensor constituting the optical converter unit 308. On an electrically insulating substrate 311, for example of glass or ceramics, there are formed in succession an auxiliary electrode 312, an insulating layer 313, a photoconductive semiconductor layer 14 of CdS.Se or a-Si:H, a semiconductor layer 315 for ohmic contact, and a pair of main electrodes 316, 317 defining a light receiving window 318 therebetween. The components 312, 316, 317 etc. may be formed in the same manner as in the foregoing embodiment shown in FIGS. 4A and 4B.

In such structure, when a positive driving voltage is supplied to the main electrode 317 with respect to the main electrode 316, the reflected light passing through the light receiving window 318 to the semiconductor layer 14 varies the current between the electrodes 316, 317, and the image information is read from the change in said current. The auxiliary electrode 312 is given a suitable desired voltage to stabilize the output of the photosensor and provide an output proportional to the light intensity.

Such a photosensor corresponds to a bit or a cell in image reading, but a plurality of such photosensors may be arranged linearly on the substrate 11 to constitute a linear image sensor of equal image size.

For example, 1728 photosensors 308 may be arranged in the width direction of the document P (a direction perpendicular to the moving direction thereof indicated by an arrow in FIG. 6). Also, as in the foregoing embodiment shown in FIGS. 5A to 5C, the photosensor, the charge accumulating unit for accumulating the output of said photosensor, the switch unit for transferring the thus accumulated charge for signal processing, and the necessary wiring patterns may be formed through the same process on the substrate.

Figure 8:
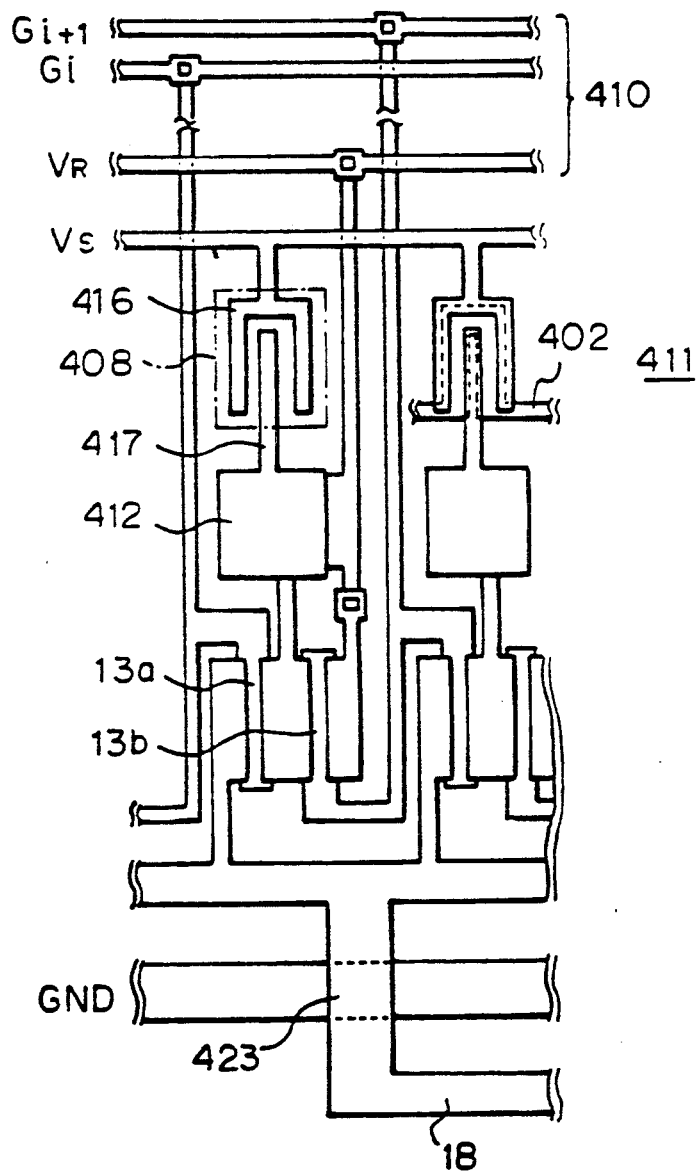
FIG. 8 is a schematic view of a principal part of a fifth embodiment of the image reading device of the present invention.

FIG. 8 is a schematic plan view of an embodiment of the image reading device in which the photosensor, charge accumulating unit, switch unit etc. are integrally formed.

In FIG. 8, there are shown matrix wirings 410; a photosensor 408; a charge accumulating unit 412; a switch unit 413 including a transfer switch 413a and a discharge switch 413b for resetting the charge of said charge accumulating unit 412; wiring 414 for supplying the output signal of the transfer switch to a signal processing unit to be explained later; and a load capacitor 423 for accumulating and reading the charge transferred by the transfer switch 413a, all of which can be composed of a multi-layer structure similar to that of the components 210, 208, 212, 213 and 223 shown in FIGS. 5A to 5C. The photosensor 408 is provided with electrode wirings 416, 417 respectively constituting a source electrode and a drain electrode, and an auxiliary electrode wiring 482 constituting a gate electrode and connected to a suitable power source. The present embodiment does not have an entrance window as shown in FIG. 5A, since the illuminating light does not come from the rear side of the substrate 411.

In the linear image sensors of the foregoing embodiments, the photosensor, charge accumulating unit, transfer switch, discharge switch and matrix wiring are all composed of a multi-layer structure having a photoconductive semiconductor layer and an insulating layer, and can therefore be formed simultaneously through the same process.

In the embodiments shown in FIGS. 4 to 8, comb-shaped main electrodes are arranged in a mutually interlacing position, and the opaque layer or auxiliary electrode is formed correspondingly, but these components may naturally be formed as shown in FIGS. 2A to 2C or in FIGS. 3C and 3D.

The conductive opaque layer or auxiliary electrode in the foregoing embodiments may be provided with a circuit as will be explained later, in order to achieve various controls.

Figure 9:
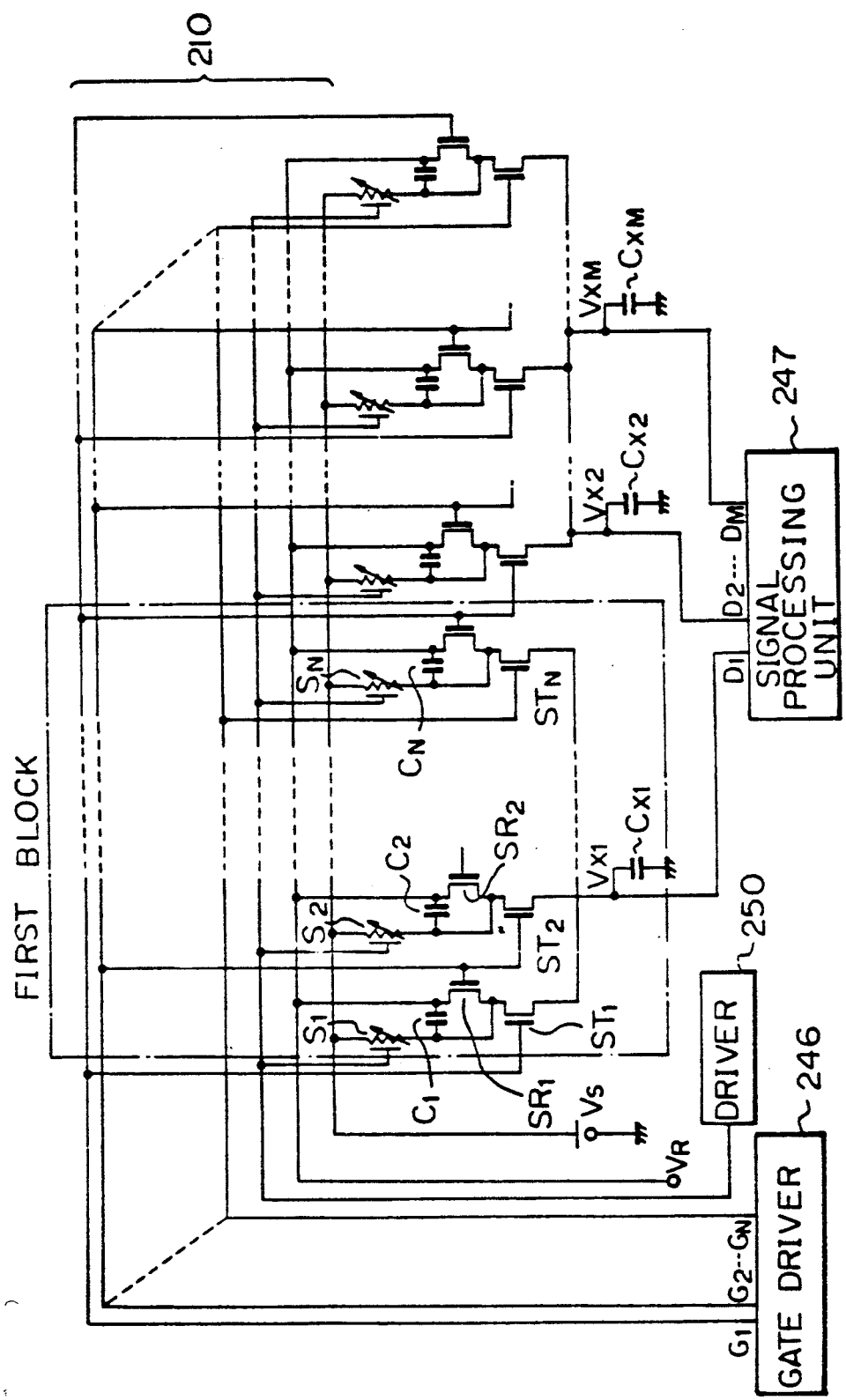
FIGS. 9 and 11 are circuit diagrams showing examples of the electric circuit for the image reading device of the present invention.

FIG. 9 is an equivalent circuit for the image reading device shown in FIG. 5 or 8.

In FIG. 9 there are shown photosensors S1, S2, ... SN (hereinafter represented by SY1) corresponding to 208 or 408, charge accumulating capacitors C1, C2, ..., CN (hereinafter represented by CY1) corresponding to 212 or 412, for accumulating charges corresponding to photocurrents of the photosensors SY1; transfer switches ST1, ST2, ..., STN (hereinafter represented by STY1) corresponding to 213a or 413a, for transferring the charge of the accumulating capacitors CY1 to a load capacitor CX1, corresponding to 223 or 423; and discharge switches SR1, SR2, ..., SRN (hereinafter written as SRY1) for resetting the charge of the accumulating capacitors CY1.

These photosensors SY1, accumulating capacitors CY1, transfer switches STY1 and discharge switches SRY1 are respectively arranged in linear arrays, and N units of these components are grouped as a block, and the entire image reading device is divided into M blocks. As an example, if the device has 1728 units, there can be selected N=32 and M=54. The gate electrodes of the transfer switches STY1 and discharge switches SRY1 arranged in arrays are connected to the matrix wirings 210, 410. The gate electrode of a transfer switch STY1 is connected to the gate electrodes of the transfer switches of a same numeral order in blocks, and the gate electrode of a discharge switch SRY1 is connected cyclically to the gate electrode of a transfer switch of a next order in the same block.

Common lines (gate driving lines G1, G2, ..., GN) of the matrix wirings 210 or 410 are driven by a gate drive unit 246. On the other hand, the output signals are supplied to a signal processing unit 247 through lead wirings 214 or 414 (output lines D1, D2, ..., DN).

The gate electrodes (opaque layer 202 or auxiliary electrode 402) of the photosensors S1, ..., SN, ..., SNxM are negatively biased by a power source 250.

In such structure, the gate drive unit 246 supplies selection pulses VG1, VG2, VG3, ..., VGN in succession to the gate driving lines G1, G2, ..., GN. When the gate driving line G1 is selected at first, the transfer switch ST1 is turned on to transfer the charge accumulated in the accumulating capacitor C1 to the load capacitor CX1. Then, when the gate driving line G2 is selected, the transfer switch ST2 is turned on to transfer the charge accumulated in the accumulating capacitor C2 to the load capacitor CX1, and simultaneously to reset the charge in the accumulating capacitor C1 by the discharge switch SR1. Then the lines G3, G4, ..., GN are selected in succession to effect the reading operation. These operations are conducted for each block, and the output signals VX1, VX2, ..., VXM of different blocks are supplied to input terminals D1, D2, ..., DM of the signal processing unit 247 and converted into serial signals therein.

A combination of the image reading device as shown in FIG. 5 or 8 with an electric control system as shown in FIG. 9 enables the following control functions to be performed.

At first, a suitable negative bias supplied to the conductive opaque layer 202 or the auxiliary electrode 402 by the power source 250 forms a depletion layer in the semiconductor layer 14 governing the photoelectric conversion, thereby sufficiently reducing the dark current and improving the output dependence on the incident light amount ($\gamma$-value), S/N ratio etc.

Also the use of a power source 250 capable of supplying the conductive opaque layer 202 or the auxiliary electrode 402 with a bias voltage corresponding to the amount of carriers defining the current in the semiconductor layer 14, and also applying a voltage of a small absolute value and of a polarity the same as that of said bias voltage during a non-reading period allows the clearing of the output in a preceding reading operation prior to next reading, thereby improving the response speed to light and realizing exact response to the incident light and stable output.

Also in an image reading device having plural photosensors, such as a linear image sensor, the power source 250 may be used to provide the conductive opaque layers 202 or the auxiliary electrodes 402 with different bias voltages according to their positions, thereby providing output signals of a smooth distribution regardless of the positions.

Figure 10:
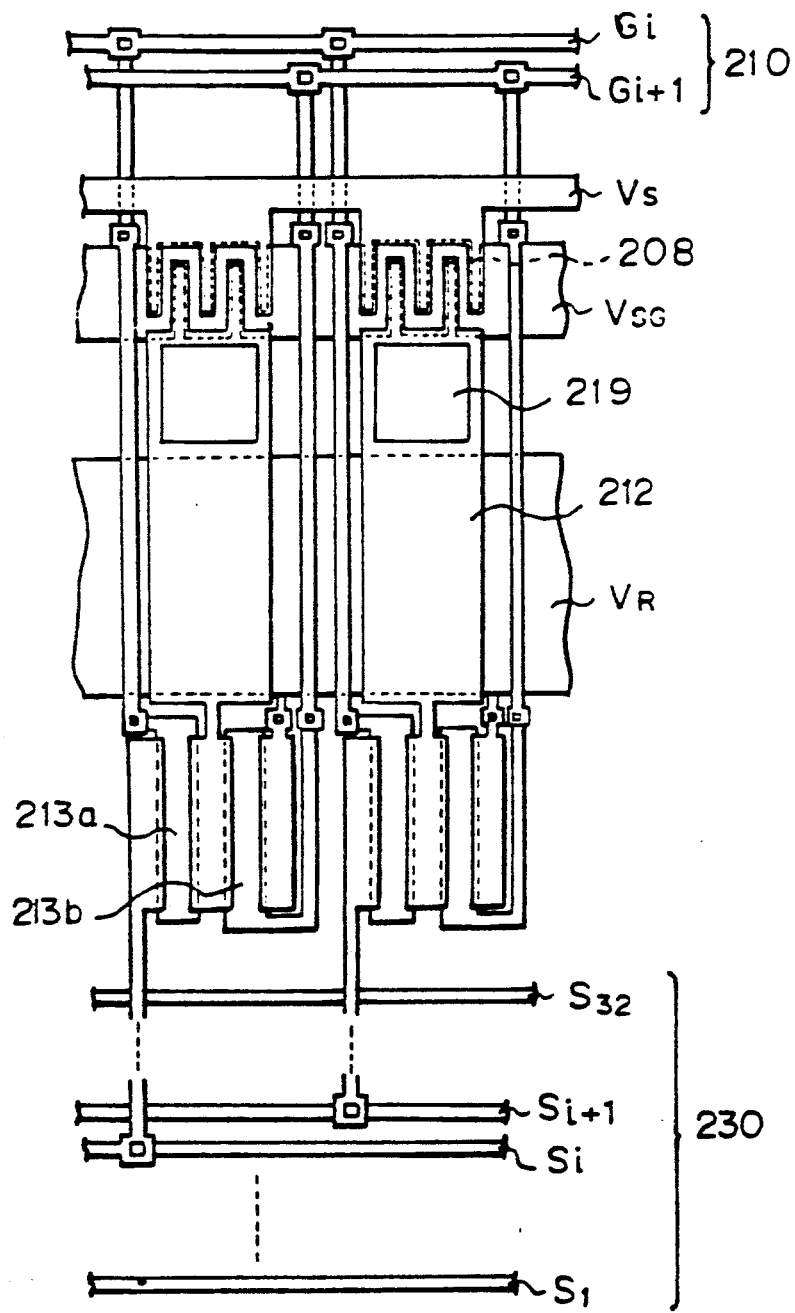
FIG. 10 is a schematic plan view showing a principal part of a sixth embodiment of the image reading device of the present invention.

FIG. 10 shows another embodiment of the image reading device in which the photosensor, charge accumulating unit and switch unit are integrally formed and which does not require an optical lens system, wherein equivalent components to those in FIGS. 5A to 5C are represented by the same numbers. 230 indicates an output signal matrix.

Figure 11:
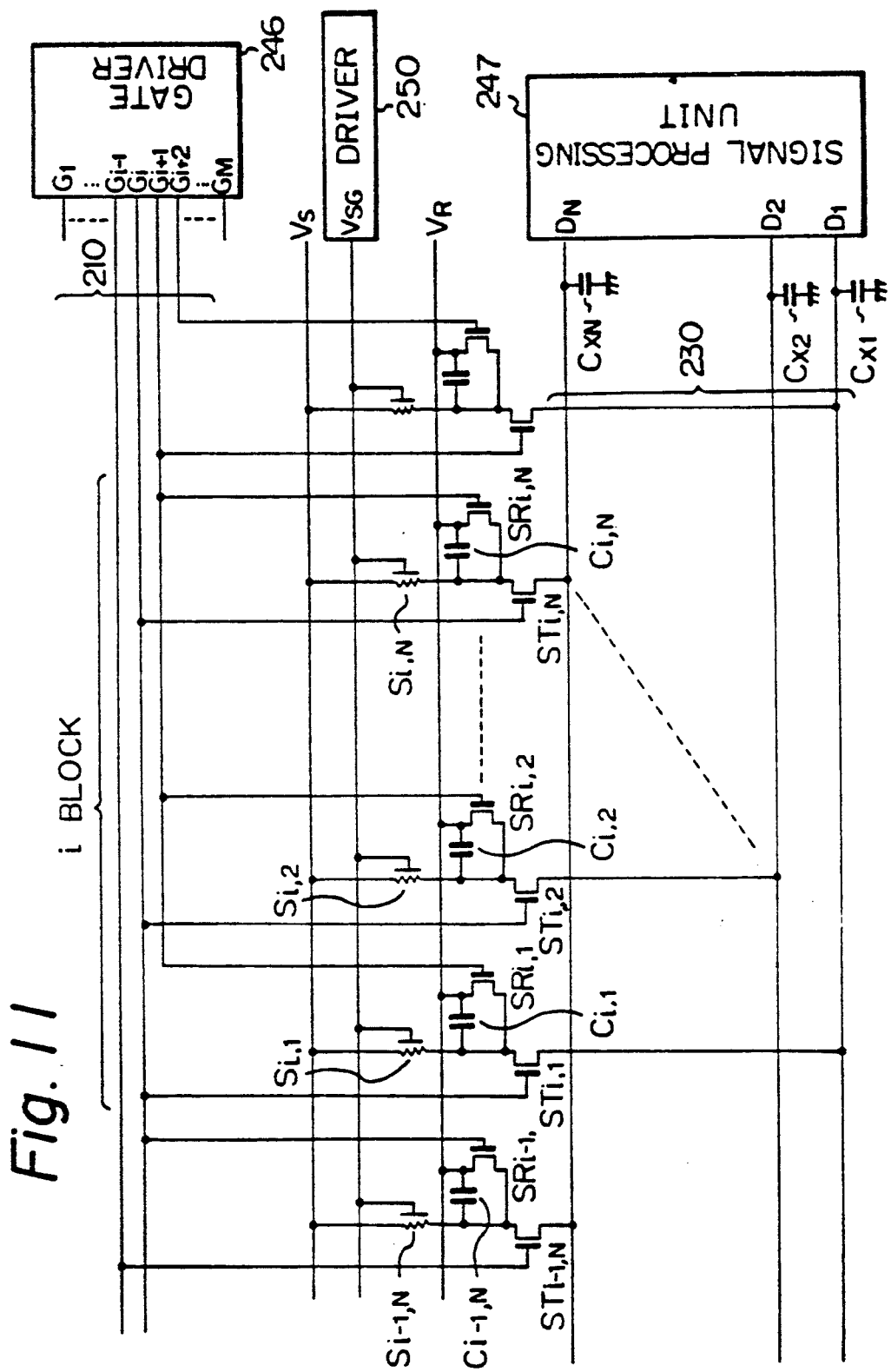

FIG. 11 shows an equivalent circuit for the device shown in FIG. 10.

In FIG. 11 there are shown photosensors $S_{i,1}$, $S_{i,2}$, ..., $S_{i,N}$ (hereinafter represented as $S_i$, where i indicates the block number, and 1−N indicates the numeral order in each block) corresponding to the photosensor 208; charge accumulating capacitors $C_{i,1}$, $C_{i,2}$, ..., $C_{i,N}$ (hereinafter represented as $C_i$) for accumulating charges corresponding to the photocurrents from the photosensors $S_i$; transfer switches $ST_{i,1}$, $ST_{i,2}$, ..., $ST_{i,N}$ (hereinafter represented as $ST_i$) corresponding to the transfer switch 213a, for transferring the charges of the accumulating capacitors $C_i$ to load capacitors $CX_1$, $CX_2$, ..., $CX_N$ corresponding to the load capacitor 223; and discharge switches $SR_{i,1}$, $SR_{i,2}$, ..., $SR_{i,N}$ (hereinafter represented as $SR_i$) corresponding to the discharge switch 213b, for resetting the charges of the accumulating capacitors $C_i$.

These photosensors $S_i$, accumulating capacitors $C_i$, transfer switches $ST_i$ and discharge switches $SR_i$ are respectively arranged in linear arrays, and are grouped by N units into a block. The entire image reading device is divided into M blocks. As an example, if the device is composed of 1728 units, there can be selected N=32 and M=54. The gate electrodes of the transfer switches ST$_i$ and the discharge switches SR$_i$ arranged in arrays are connected to the gate wirings 210. The gate electrodes of the transfer switches ST$_i$ are commonly connected within each block. The gate electrode of a discharge switch SR$_i$ is cyclically connected to the gate electrode of the transfer switch in a next block.

Common lines (gate driving lines G1, G2, ..., GM) of the matrix wirings 210 are driven by a gate drive unit 246. On the other hand, the output signals are supplied, in the unit of each block, to a signal processing unit 247, through matrix lines 230 (output lines D1, D2, ..., DN).

The gate electrodes (opaque layers 202) of the photosensors S$_{i,1}$, S$_{i,2}$, ..., S$_{N,N}$ are negatively biased by a power source 250.

In such structure, the gate driving unit 246 supplies selection pulses VG1, VG2, ..., VGM in succession to the gate driving lines G1, G2, ..., GM. At first, when the gate driving line G1 is selected, the transfer switches ST1 are turned on to transfer the charges accumulated in the accumulating capacitors G1 to the load capacitors CX$_1$–CX$_N$. Then, when the gate driving line G2 is selected, the transfer switches ST2 are turned on, to transfer the charges of the accumulating capacitors C2 to the load capacitors CX$_1$–CX$_{32}$ and to simultaneously reset the charges in the accumulating capacitors C1 through the discharge switches SR1. Then the lines G3, G4, ..., GM are selected in succession in a similar manner to effect the image reading operations. These operations are affected for different blocks, and the output signals VX1, VX2, ..., VXN of different blocks are supplied to the input terminals D1, D2, ..., DN of the signal processing unit 247 and are converted therein into serial signals.

Also in the present embodiment, the conductive opaque layer can be utilized for various controls as already explained in relation to FIG. 9.

As explained in the foregoing, the conductive opaque layer or the auxiliary electrode in the foregoing embodiments may be used for various control functions for improving the characteristics of the photosensors, but the conductive opaque layer or auxiliary electrode of the present invention is principally capable of significantly reducing the capacitance resulting from the spatial overlapping with the main electrodes thereby improving the response speed to light and reducing the frequency of malfunctions resulting from defects in the insulating layer such as pinholes.

Figure 12:
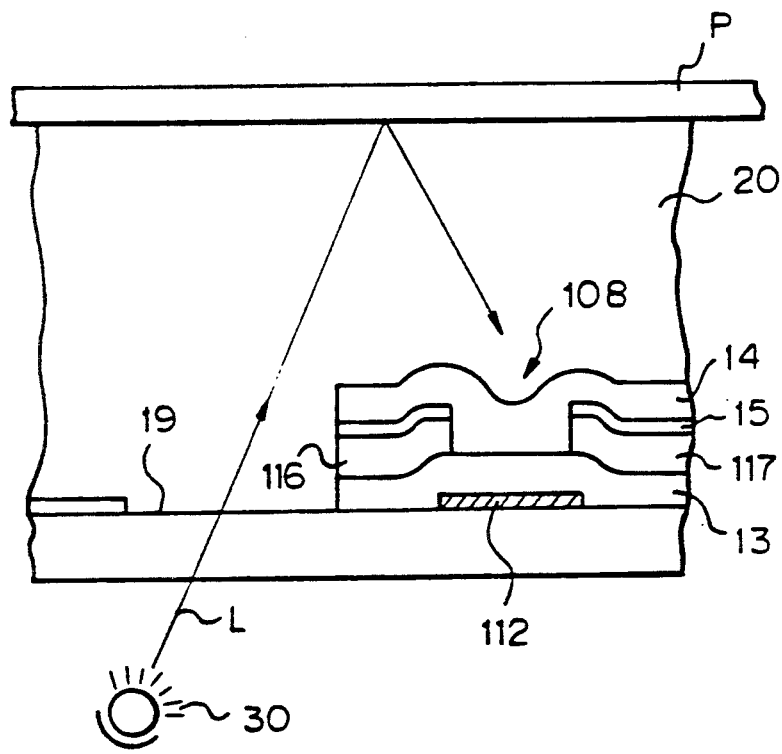
FIG. 12 is a schematic plan view showing a principal part of a seventh embodiment of the image reading device of the present invention.

The foregoing embodiments have shown image reading devices of a staggered arrangement in which the main electrodes (116, 117 in FIG. 2A) and the opaque layer (112 in FIG. 2A) are positioned across the semiconductor layer, but a similar effect can also be obtained in a structure in which, as shown in FIG. 12, main electrodes 116, 117, composed for example of aluminum, and an opaque layer 112 are arranged on a same side of the semiconductor layer 14. In FIG. 12, same components as those in the foregoing drawings are represented by the same numbers.

As explained in the foregoing, the present invention improve various sensor characteristics such as the response speed to light, and provides an image reading device of high reliability.

Also the present invention, in which the conductive layer only slightly overlaps with the upper electrodes, allows to significantly reduces the capacitance when said conductive layer is used as a gate electrode for said upper electrodes, and prevents short circuiting even if the insulating layer has defects such as pinholes.

What is claimed is:

1. In an image reading device having, on a substrate, plural photosensors each provided with conductive layer, an insulating layer formed on the conductive layer, a semiconductor layer formed on the insulating layer, and a pair of main electrodes positioned in contact with the semiconductor layer and defining a predetermined gap therebetween, said electrodes being formed so as not to substantially overlap said conductive layer; and improvement comprising:
   a bias voltage supply circuit for supplying the conductive layers with different bias voltage according to positions of arrangement of the photosensors.

2. An image reading device according to claim 1, wherein said photosensors are linearly arranged on the substrate, in the width direction of an original image.

3. An image reading device according to claim 2, wherein the linearly arranged photosensors are divided into blocks each containing a predetermined number of photosensors, and wherein said bias voltage supply circuit supplies said different bias voltage in units of the blocks.

* * * * *

UNITED STATES PATENT AND TRADEMARK OFFICE
CERTIFICATE OF CORRECTION

PATENT NO. : 5,128,532  
DATED : July 7, 1992  
INVENTOR(S) : ITABASHI ET AL.

Page 1 of 3

It is certified that error appears in the above-identified patent and that said Letters Patent is hereby corrected as shown below:

TITLE PAGE
AT [57] ABSTRACT

Line 3, "and" should read --an--.

COLUMN 1

Line 14, "1.Field" should read --1. Field--.
    Line 24, "device" should read --devices--.
    Line 40, "ling" should read --line--.
    Line 55, "electrode 7" should read --electrode 7,--.
    Line 58, "of which change" should read --change of which--.

COLUMN 2

Line 1, "FIG.IA)" should read --FIG 1A)--.

COLUMN 3

Line 33, "thus," should read --thus--.
    Line 50, "exmaple" should read --example--.
    Line 53, "pair" should read --a pair--.

COLUMN 4

Line 3, "-8 lines/mm," should read --4-8 lines/mm,--.
    Line 9, "deice" should read --device--.

COLUMN 6

Line 12, "illustrate" should read --illustrates--.
    Line 66, "wiring 482" should read --wiring 402--.

UNITED STATES PATENT AND TRADEMARK OFFICE
CERTIFICATE OF CORRECTION

PATENT NO. : 5,128,532
DATED : July 7, 1992
INVENTOR(S) : ITABASHI ET AL.

It is certified that error appears in the above-identified patent and that said Letters Patent is hereby corrected as shown below:

COLUMN 8

Line 27, "next" should read --the next--.
    Line 42, "230" should read --Numeral 230--

COLUMN 9

Line 30, "affected" should read --effected--.

COLUMN 10

Line 12, "same" should read --the same--.

COLUMN 10

Line 15, "improve" should read --improves--.
    Line 20, "allows to" should be deleted.
    Line 26, "conductive" should read --a conductive--.
    Line 33, "and" should read --an--.
    Line 35, "voltage" should read --voltages--.
    Line 45, "voltage" should read --voltages--.

UNITED STATES PATENT AND TRADEMARK OFFICE
CERTIFICATE OF CORRECTION

PATENT NO. : 5,128,532
DATED : July 7, 1992
INVENTOR(S) : ITABASHI ET AL.

It is certified that error appears in the above-indentified patent and that said Letters Patent is hereby corrected as shown below:

COLUMN 10

Line 45, "voltage" should read --voltages--.

Signed and Sealed this

Fourteenth Day of December, 1993

Attest:

BRUCE LEHMAN

Attesting Officer      Commissioner of Patents and Trademarks